United States Patent [19]

Hiroki et al.

[11] Patent Number: 5,165,075
[45] Date of Patent: Nov. 17, 1992

[54] ELECTRO-OPTIC DEVICE HAVING PAIRS OF COMPLEMENTARY TRANSISTORS

[75] Inventors: Masaaki Hiroki; Akira Mase, both of Kanagawa, Japan

[73] Assignee: Semiconductor Energy Laboratory Co., Ltd., Kanagawa, Japan

[21] Appl. No.: 758,904

[22] Filed: Sep. 11, 1991

[30] Foreign Application Priority Data

Dec. 10, 1990 [JP] Japan ............... 2-415722

[51] Int. Cl.⁵ .............................. G02F 1/13
[52] U.S. Cl. .................... 359/59; 359/54; 340/784
[58] Field of Search ............ 359/54, 59, 87; 340/784; 357/4, 23.7

[56] References Cited

U.S. PATENT DOCUMENTS

| 4,332,075 | 6/1982 | Ota et al. | 357/4 |
|---|---|---|---|
| 4,818,077 | 4/1989 | Ohwada et al. | 359/59 |
| 4,851,827 | 7/1989 | Nicholas | 340/784 |
| 4,917,467 | 4/1990 | Chen et al. | 359/59 |
| 4,938,565 | 7/1990 | Ichikawa | 359/59 |
| 4,962,413 | 10/1990 | Yamazaki et al. | 359/59 |

FOREIGN PATENT DOCUMENTS

| 0375233 | 6/1990 | European Pat. Off. | |
| 3604368 | 8/1986 | Fed. Rep. of Germany | |
| 0144297 | 12/1978 | Japan | 340/784 |
| 0068724 | 3/1989 | Japan | 340/784 |
| 1-130131 | 5/1989 | Japan | 340/784 |
| 2-050132 | 2/1990 | Japan | |
| 0051129 | 2/1990 | Japan | 340/784 |
| 2172745A | 9/1986 | United Kingdom | |
| 2172745B | 7/1988 | United Kingdom | |

OTHER PUBLICATIONS

Japanese Journal of Applied Physics, Supplements, vol. 22, No. 22-1, 1983, M. Matsui et al., "A 10×10 Polycrystalline-Silicon Thin-Film Transistor Matrix for Liquid-Crystal Display", pp. 497-500.

Primary Examiner—Janice A. Howell
Assistant Examiner—Huy K. Mai
Attorney, Agent, or Firm—Sixbey, Friedman, Leedom & Ferguson

[57] ABSTRACT

A novel structure of an active electro-optic device is disclosed. The device is provided with complementary transistors therein which comprise a p-channel TFT and an n-channel TFT. In case of a liquid crystal electro-optic deivce, the device comprises a pair of substrates, a liquid crystal provided therebetween, picture element electrode islands arranged in matrix form and provided on one of the substrates, complementary transistors provided thereon, and signal lines provided thereon. Gate electrodes of p-channel and n-channel transistors of these complementary transistors are connected to some of the signal lines while source (or drain) electrodes thereof are connected to the electrode islands and drain (or source) electrodes thereof are connected to other signal lines.

8 Claims, 10 Drawing Sheets

FIG. 4(A)
FIG. 4(C)
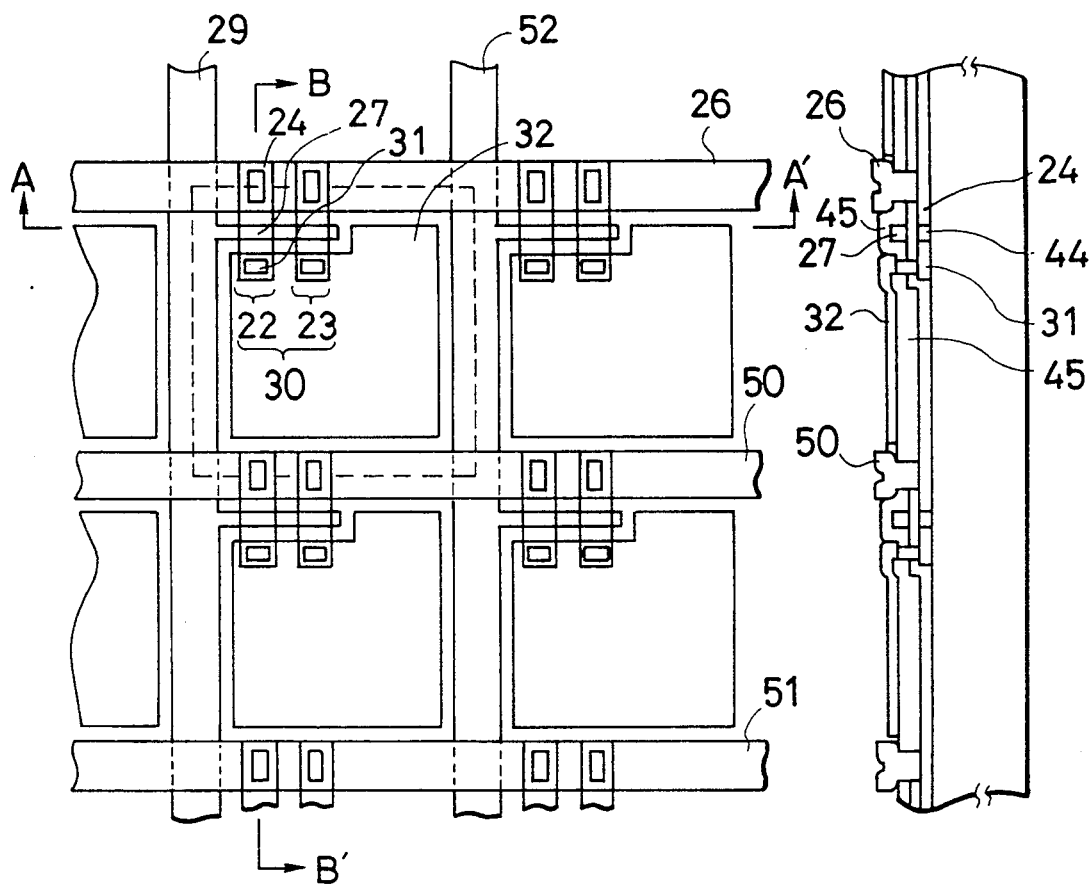
FIG. 4(B)
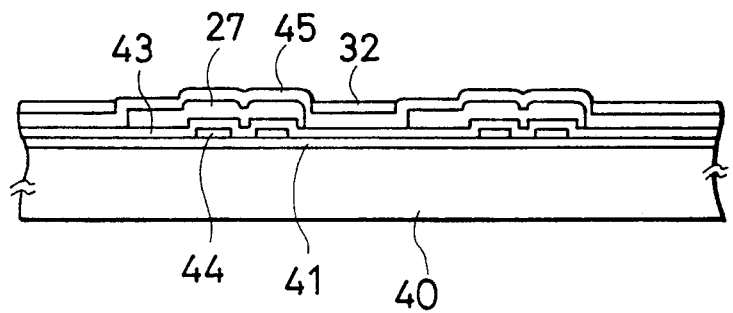

ELECTRO-OPTIC DEVICE HAVING PAIRS OF COMPLEMENTARY TRANSISTORS

BACKGROUND OF THE INVENTION

1. Field of the Invention

The present invention relates to an active electro-optic device, e.g. to an active liquid crystal electro-optic device and, in particular, to a device provided with two thin film gate insulated field effect transistors (hereinafter referred to as TFT) on each picture element, which is named in the present invention as complementary thin film transistor (hereinafter referred to as C/TFTs) having a structure of modified transfer gate(MTG).

2. Description of the Prior Art

An active type liquid crystal electro-optic device utilizing TFT is conventionally known. In this device, an amorphous or polycrystalline semiconductor is used for TFT, while either p-channel or n-channel TFT is used for each picture element thereof. Namely, a N-channel TFT (referred to as a NTFT) is generally linked to the picture element in series. A typical example thereof is indicated in FIG. 1.

Referring to FIG. 1, which shows an equivalent circuit of the liquid crystal electro-optic device in matrix form, NTFT is linked to a liquid crystal 1, in series.

In general, a large matrix device such as 640×480, or 1260×960 matrix device is used, whereas in the drawing, a simple example of matrix arrangement of 2×2 is shown in the same context. Voltage is supplied from peripheral circuits 3, 4 to each picture element. The picture element is turned ON or OFF in accordance with the voltage. When the ON/OFF characteristic of TFT is good, a liquid crystal electro-optic device of high contrast can generally be prepared. When the liquid crystal electro-optic device is actually manufactured, however, there often is a case where the voltage $V_{LC}$ 5, the output of TFT, i.e. the input for the liquid crystal (referred to as liquid crystal electric potential) does not become "1" (high) when it should have been "1" (high), or otherwise, does not become "0" (low) when it should have been "0" (low). This inconvenience occurs in the case of the TFT which is a switching device applying a signal to the picture element being put into an assymetrical state in the ON/OFF condition.

The liquid crystal 1 is basically insulating, and the liquid crystal electric potential ($V_{LC}$) is floating when TFT is OFF. Since the liquid crystal 1 is equivalently a capacitor, the $V_{LC}$ can be determined based on the charge accumulated therein. When the resistance of the liquid crystal becomes comparatively small at $R_{LC}$ 6, or current leakage occurs due to the existance of a dust or of an ionic impurity, or when a pin hole is formed in the gate insulating film of the TFT as shown in FIG. 1 at $R_{GS}$ 7, the charge is leaked therefrom, whereby a $V_{LC}$ is put into an unstable condition, and high yield cannot be achieved in the liquid crystal electro-optic device that has as much as 200,000–5,000,000 pieces of picture elements in one panel. In particular for the liquid crystal material 1, TN (Twisted Nematic) liquid crystal is typically used. For the orientation of the liquid crystal, a rubbed orientation control film is provided on each electrode. Due to the static electricity generated in the rubbing process, weak dielectric breakdown occurs and leakage occurs between adjacent conductors such as picture element electrodes and electric lines (wires) or leakage occurs in the weak gate insulating film. For the active liquid crystal electro-optic device, it is of particular importance to maintain a certain level of the liquid crystal electric potential, as the same value as an initial value in one frame. Practically, however, this is not always the case because of a lot of defects existing in the TFT part.

In the case where the liquid crystal material is a ferroelectric liquid crystal, it is necessary to increase injection current. For that purpose, TFT is increased in size so as to increase current margin, which is a disadvantage.

BRIEF SUMMARY OF THE INVENTION

An object of the present invention is to provide an electro-optic device with a stable performance.

It is another object of the present invention to provide an electro-optic device comprising complementary transistors capable of driving the device with stable driving signal levels of '1' and '0'.

To achieve the foregoing and other object, an electro-optic device is provided with a picture element electrode island on a substrate thereof, a first signal line thereon, a second signal line thereon, and complementary transistors comprising a p-channel TFT and an n-channel TFT thereon and one of the input/output terminals of the p-channel TFT and one of the input/output terminals of the n-channel TFT are connected to the electrode island while the other one of the input/output terminals of the p-channel TFT and the other one of the input/output terminals of the n-channel TFT are connected to the first line and gate electrodes of the p-channel and n-channel TFTs are connected to the second signal line. A matrix display device can be obtained by increasing the number of the above structure on the substrate.

The complementary thin film transistors in accordance with the present invention is complimentary thin film transistors (hereinafter referred to as C/TFTs) for which: one of the input/output terminals of a N-channel thin film transistor (hereinafter referred to as NTFT) and one of the input/output terminals of a P-channel thin film transistor (hereinafter referred to as PTFT) are connected with one another; gate electrodes of the P- and N-channel thin film transistors are connected with one another; the connected terminals work as a source or drain electrode.

An equivalent circuit of a typical electro-optic device of the present invention is shown in FIG. 2. In the example of the 2×2 matrix driven by peripheral circuits 20, 21 shown in FIG. 2, one side 24 of the source and drain electrodes of PTFT 22 and one side 25 of the source and drain electrodes of NTFT 23 are connected to one signal line $V_{DD}$ 26, while the others are connected to a picture element electrode, and gates 27, 28 to other signal line $V_{GG}$ 29. By forming such a structure, the liquid crystal electro-optic device is obtained, which allows the electric potential applied to the picture element electrode at the time of ON/OFF of the C/TFTs comprising PTFT 11 and NTFT, to be stable enough to be fixed to "1" or "0", whereby the level is not drifted in one frame.

By providing the complementary gate insulated field effect transistors which form a part of the present invention, on each picture element, so as to control the voltage applied to the picture element of the display part, a liquid crystal electro-optic device that has a clear ON/OFF characteristic is obtained.

BRIEF DESCRIPTION OF THE DRAWINGS

The accompanying drawings, which are incorporated in and form a part of the invention and together with the description, serve to explain the principle of the invention.

FIG. 4(A) is a plan view showing an example of the arrangement of electrode or of the TFT corresponding to 2×2 of the active matrix liquid crystal electro-optic device in accordance with the present invention.

FIG. 4(B) and FIG. 4(C) are cross sectional views corresponding to the positions indicated as A—A' and B-B' lines in FIG. 4(A), respectively.

DETAILED DESCRIPTION OF THE PREFERRED EMBODIMENTS

Preferred Embodiment 1

Figure 1:
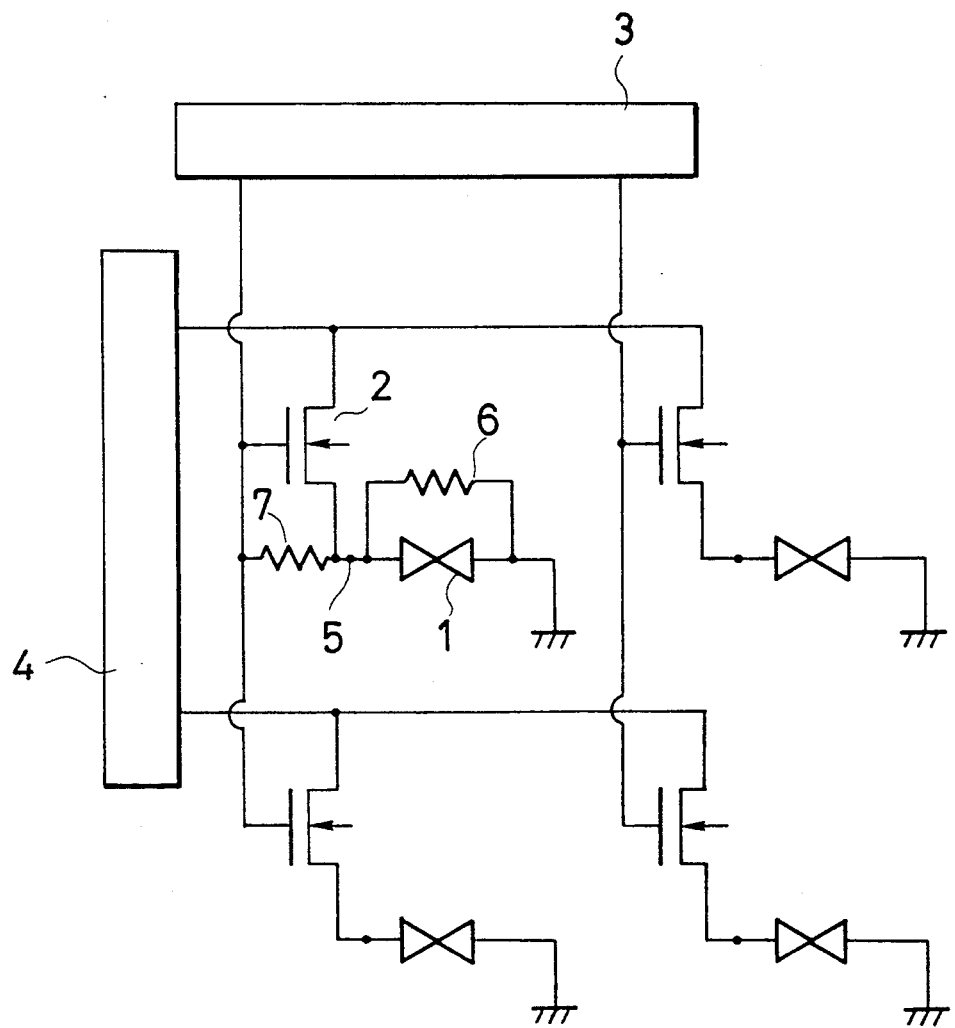
FIG. 1 shows an example of a circuit of a conventional active matrix liquid crystal electro-optic device. The matrix of the display corresponds to 2×2.

Referring to FIGS. 3 and 4, a display device in accordance with preferred embodiment 1 will be described. The manufacturing process of TFT is explained by using FIG. 3. The manufacturing method of PTFT 22 is a main subject here, and NTFT 23 was manufactured employing basically the same manufacturing process as this.

Referring to FIG. 3, a silicon oxide film 41 was manufactured in thickness of 1000–3000Å as a blocking layer on a glass substrate 40 of such as AN glass, or Pyrex glass, that is resistant to the heat treatment at a temperature of approximately 600° C., by magnetron RF (high frequency) sputtering. The process conditions are: 100% oxygen atmosphere; temperature for the film formation of 150° C.; output of 400–800 W; pressure of 0.5 Pa. A deposition rate in case of using quartz or single crystalline silicon for target was 30–100Å/minute. A silicon film 42 was formed on the silicon oxide film 41 by LPCVD (Low Pressure Chemical Vapor Deposition), sputtering or plasma CVD, and patterned by known photolithography to obtain structure as shown in FIG. 3(A).

In the case where the silicon film is formed by LPCVD, disilane ($Si_2H_6$) or trisilane ($Si_3H_8$) was supplied to a CVD device, at the temperature 100°–200° C. lower than that for crystallization, ranging from 450° to 550° C., e.g. at 530° C. Pressure in a reactive furnace was 30–300 Pa and deposition rate was 50–250Å/minute. In order to control threshold voltage (Vth) for NTFT and PTFT to almost the same level, boron may be added at the time of film formation at a concentration of $1 \times 10^{14} - 1 \times 10^{17}$ cm$^{-3}$, using diborane.

In the case where the silicon film is manufactured by sputtering, back pressure of a chamber before sputtering was not more than $1 \times 10^{-5}$ Pa, and the manufacture was carried out in an atmosphere where 20–80% of hydrogen was incorporated into argon, using single crystalline silicon as a target: for example, 20% of argon and 80% of hydrogen; depositing temperature of 150° C.; frequency of 13.56 MHz, sputtering output of 400–800 W; and pressure of 0.5 Pa.

In the case where the silicon film is formed by plasma CVD, the temperature was, for example, 300° C., and monosilane ($SiH_4$) or disilane ($Si_2H_6$) was used, which was introduced into a PCVD device, and underwent the application of high frequency power of 13.56 MHz thereto, for film formation.

The coated film formed by these methods is typically subjected to crystallization process in a subsequent process as described infra. The concentration of oxygen included in the coated film is preferably not more than $7 \times 10^{19}$ cm$^{-3}$, more preferably not more than $1 \times 10^{19}$ cm$^{-3}$, in order to facilitate the crystallization process. According to the results of SIMS (Secondary Ion Mass Spectrometry) on the coated film obtained in accordance with this embodiment, the level of impurities was $8 \times 10^{18}$ cm$^{-3}$ for oxygen, $3 \times 10^{16}$ cm$^{-3}$ for carbon, and $4 \times 10^{20}$ cm$^{-3}$ for hydrogen, which was one atom % compared with the silicon defined as $4 \times 10^{22}$ cm$^{-3}$.

After the amorphous silicon film was manufactured to a thickness ranging from 500 to 3000Å, e.g. 1500Å, middle temperature heat treatment was carried out at a temperature of 450°–700° C., in a non-oxide atmosphere, for 12–70 hours, for example, at 600° C., in a nitrogen or hydrogen atmosphere. Since an amorphous silicon oxide film is formed on the substrate surface under the silicon film, specific core does not exist during the heat treatment, and the whole body is uniformly heated and annealed. As deposited, the film has an amorphous structure, with hydrogen simply incorporated therein. By employing the annealing, the silicon film is transformed from the amorphous structure into another state of higher order, a part of which shows a crystalline condition. In particular, a relatively higher order region of the coated film formed by the foregoing methods (LPCVD, sputtering, and plasma CVD) tends to be crystallized into a crystalline region. However, silicon atoms are pulled with each other since bonds are formed between such regions by silicon atoms existing therebetween. In observation of crystallinity of the film, Laser Raman Spectroscopy results show a peak shifted to the frequency lower than the single crystalline silicon peak of 522 cm$^{-1}$. The apparent grain size calculated based on a half band width is 50–500Å, which is a level of microcrystal: actually, the region of higher degree of crystallization is many in number, having a cluster structure, and a coating of semiamorphous structure in which each cluster is anchored with each other through the respective silicons, was formed. Consequently, the film shows a state where it can be said that substantially no grain boundary (referred to as GB) exist therein. Since carriers can move between clusters through the anchored points, carrier mobility becomes higher than that of polycrystalline silicon in which GB obviously exists. Namely, Hall mobility ($\mu h$) = 10–200 cm$^2$/Vsec, electron mobility ($\mu e$) = 15–300 cm$^2$/Vsec can be obtained.

On the other hand, polycrystalline silicon may be formed by polycrystallization of a film by means of high temperature annealing at a temperature ranging from 900° to 1200° C., instead of the middle temperature annealing as described above. In this case, due to the segregation of the impurities in the film caused by the solid phase growth from the core, impurities such as oxygen, carbon, and nitrogen are increased in GB, that is, a barrier is formed at GB, whereby, though mobility in the crystal is large, the barrier at GB hinders the carrier movement there. As a result, it is hard to achieve the mobility not less than 10 cm$^2$/Vsec, in practice. By decreasing, however, the concentrations of the impurities such as carbon (C), nitrogen (N), or oxygen (O) to several up to one several tenth of that of a semi-amorphous semiconductor, higher mobility of 30–300 cm$^2$/Vsec can be obtained.

As mentioned above, in the embodiment in accordance with the present invention, the silicon semiconductor having a semiamorphous or semi-crystal or crystal structure is used, on which a silicon oxide film was formed as a gate insulating film 43 in thickness ranging from 500 to 2000 Å, e.g. at 1000 Å. The manufacturing conditions were of the same as for the silicon oxide film 41 as blocking layer. To the coated film, a small amount of fluorine may be added during formation of the film. Further, on the upper surface thereof, a silicon film doped with phosphorus at $1-5 \times 10^{20}$ cm$^{-3}$, or a multi-layered film comprising this silicon film and molybdenum (Mo), tungsten (W), MoSi$_2$ or WSi$_2$ film formed thereupon, was formed, which was then subjected to patterning process using photomask, so as to form a gate electrode 27. A shape shown in FIG. 3(B) was thus obtained: a channel length of 10 $\mu$m; and P-doped Si of 0.2 $\mu$m as a gate electrode, on which molybdenum at 0.3 $\mu$m.

Figure 3A:
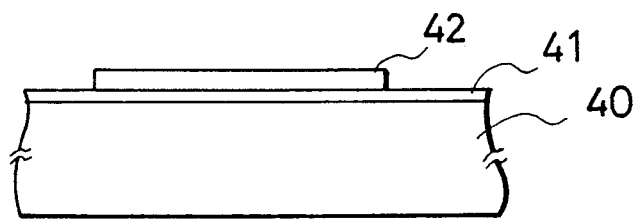
FIGS. 3(A)–(F) are schematic cross sectional views showing a manufacturing process of the TFT applicable to the present invention.
Figure 3B:
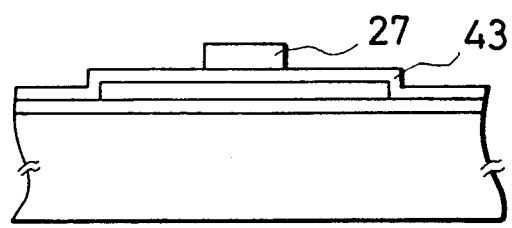
Figure 3C:
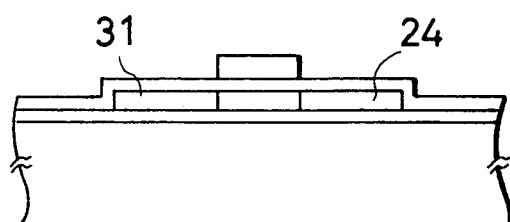

Referring to FIG. 3(C), a photoresist was formed using photomask, and, for PTFT, boron was added at a dose of $1 \times 10^{15}$ cm$^{-2}$ to a source 24 and a drain 31, by ion implantation. For NTFT, phosphorus was added thereto at a dose of $1 \times 10^{15}$ cm$^{-2}$ by ion implantation or by plasma doping, so as to form a source 25 and a drain 33 for NTFT. In this embodiment, since PTFTs 22 and NTFTs 23 are parallel as shown in FIG. 4, one conductivity type TFTs are masked with photoresists or the like when carrying out ion implantation to the other conductivity type TFTs. The ion implantation was carried out in both cases through a gate insulating film 43. Or otherwise, referring to FIG. 3(B), with the gate electrode 27 as a mask, silicon oxide on the silicon film can be removed, after which, boron or phosphorus can be ion-implanted directly in the silicon film. Thermal annealing was carried out again at 600° C., for 10–50 hours in order to activate the impurities. The source 25 and the drain 33 for NTFT, as well as the source 24 and the drain 31 for PTFT in FIG. 4 were obtained as N$^+$-type and P$^+$-type, respectively by the activation. Under the gate electrode 27, a channel forming region 44 is obtained as a crystalline semiconductor of higher mobility.

In this way, in addition to employment of a self-aligning manner, C/TFT 30 shown in FIG. 4 can be prepared without elevating a temperature to higher than 700° C. during the manufacture thereof. Therefore, it is not necessary to use an expensive substrate such as quartz. Therefore, the process of the present invention is suitable for manufacturing a liquid crystal display device having a large display area.

Figure 3D:
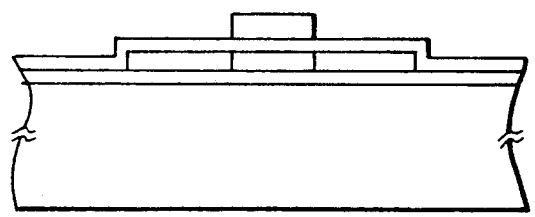
Figure 3E:
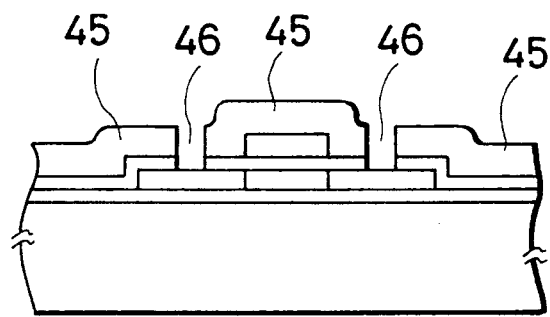
Figure 3F:
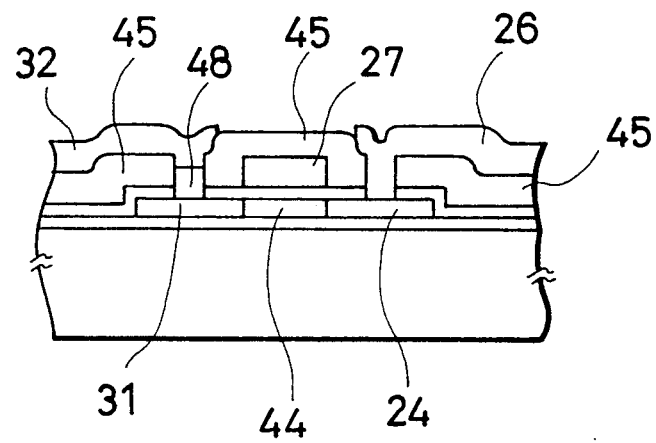

Referring to FIGS. 3(A) and 3(D), thermal annealing was performed twice, however, the annealing related to FIG. 3(A) can be omitted according to the required characteristic, with both annealings replaced with one annealing related to FIG. 3(D), so as to curtail the manufacturing time. Referring to FIG. 3(E), a silicon oxide film was formed as an interlayer insulating film 45 by the above-mentioned sputtering. The formation of the silicon oxide film can be carried out by LPCVD or by photo-CVD. The thickness of the interlayer insulating film 45 was, for example, 0.2–0.4 $\mu$m. After the formation a window 46 for electrode was formed using a photomask. Aluminum was then formed over the entire surface thereof by sputtering and patterned using a photomask to form an electrode 26 and a contact 48. Further, an ITO (Indium Tin Oxide film) was deposited by sputtering and patterned by etching using a photomask to obtain picture element electrodes 32 as shown in FIG. 4(A). As shown in FIG. 4(A), two TFTs 22 and 23 are complementary transistors. As shown in FIG. 4(A), output terminals of the TFTs 22 and 23 are connected to the picture element electrode 32 of the liquid crystal device. The ITO was deposited at room temperature up to 150° C., and was annealed in oxygen atmosphere or in the atmosphere at 200°–400° C.

In this way, PTFT 22, NTFT 23, and the electrode 32 of the transparent conductive film were formed on the same glass substrate 40. Properties of the TFT are briefly described in a table 1 below:

TABLE 1

| | Mobility $\mu$ (cm$^2$/Vs) | $V_{th}$ (threshold voltage) |
|---|---|---|
| PTFT | 20 | −3 |
| NTFT | 30 | +3 |

Figure 2:
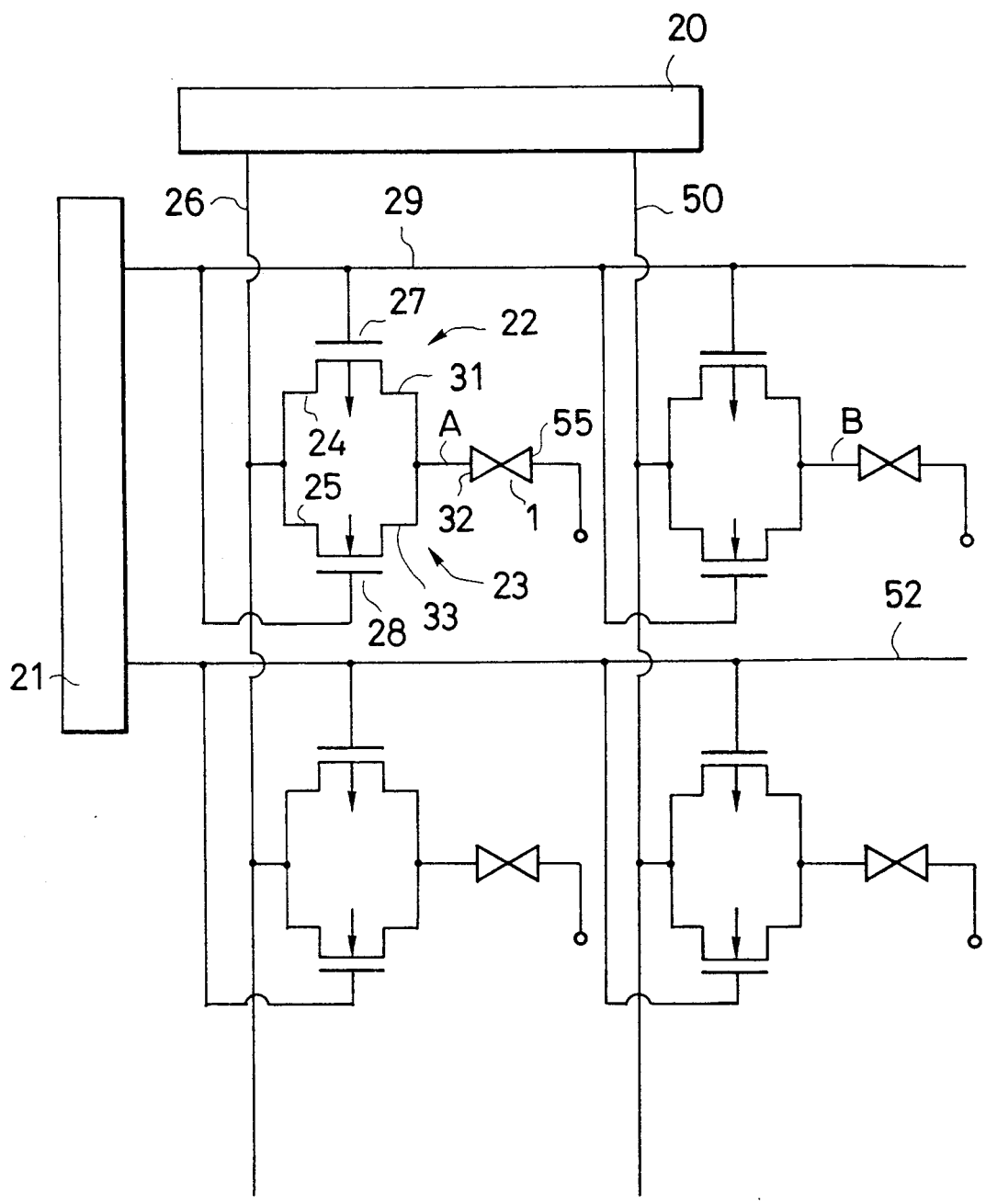
FIG. 2 shows an example of a circuit of active matrix liquid crystal electro-optic device in accordance with the present invention. The matrix of the display corresponds to 2×2.

By using the semiconductor prepared in this way, large mobility was achieved in TFT, which had been generally accepted as impossible. The complementary TFTs for a liquid crystal electro-optic device and the like as shown in FIGS. 2, 3, and 4, i.e. MTG-C/TFTs were thus formed for the first time.

Referring to FIG. 4, wirings in X-axis direction (hereinafter also referred to as X-line) such as $V_{DD}$ line 26, $V_{DD'}$ line 50, and $V_{DD''}$, line 51 were formed. In a Y-axis direction, wirings in Y-axis direction (hereinafter also referred to as Y-line) such as $V_{GG}$ line 29 and $V_{GG'}$, line 52 were formed. FIG. (A) is a plan view, whose A—A' longitudinal section is shown in FIG. 4(B), while B—B' longitudinal section in FIG. 4(C). NTFT 23 and PTFT 22 are provided near the intersection of the X-line $V_{DD}$ 26 and the Y-line $V_{GG}$ 29, so as to form C/TFTs 30. C/TFTs having the same structure were formed for the other picture elements to obtain a matrix structure shown in FIG. 4(A). In NTFT 23 and PTFT 22 that constitute C/TFT 30, source and drain regions are connected to a picture element electrode 32 made of a transparent conductive film 32 and to one signal line 26 having the matrix structure, through the contact 48 and electrode. On the other hand, gate electrodes 27, 28 of NTFT 23, PTFT 22 are linked to a gate wiring of other signal line 29.

A pixel was thus formed out of the transparent conductive film 32 and C/TFT 30 on the inside of the space surrounded by two X-lines 26, 50 and Y-lines 29, 52 as well. By repeating the structure horizontally and vertically, one example of 2×2 matrix, or the liquid crystal electro-optic device of the enlarged versions of large display area such as 640×480 or 1280×960 was thus manufactured.

FIG. 4 shows a structure of one of substrates which sandwich the liquid crystal in the liquid crystal electro-optic device. On said one of substrates an orientation control film was formed and subjected to orientation process and said one of substrates and the other one of the substrates having other picture element electrode 55 were arranged in parallel at a certain interval by a known method. A liquid crystal material was injected therein, so as to complete the liquid crystal electro-optic device in accordance with this embodiment. When a TN liquid crystal is to be used as the liquid crystal material, the interval between the respective substrates is approximately 10 μm, and the orientation films subjected to rubbing treatment have to be formed on transparent conductive films formed on both of the substrates.

When a ferroelectric liquid crystal is to be used as the liquid crystal material, operating voltage is, for example, ±20 V, while the interval of the cell 1.5-3.5 μm, e.g. 2.3 μm, and the orientation control film is provided only on a counter electrode 55 and subjected to rubbing process.

When a dispersive liquid crystal or a polymeric liquid crystal is to be used; orientation control film is not needed; driving voltage determined as ±10-±15 in order to increase switching speed; and an interval of the cell, namely that between a pair of substrates by which the liquid crystal is sandwiched, is as thin as 1-10 μm. When the dispersive liquid crystal is used, in particular, since a polarizing plate is not necessary, quantity of light transmitted by the liquid crystal device can be increased in a reflective mode, as well as in a transmission mode. Further, since the liquid crystal does not have a threshold, by using the driving device (C/TFT) in accordance with the present invention, large contrast was obtained because the driving device in accordance with the present invention has a clear threshold voltage, while crosstalk or damaging interference with adjacent picture element, was removed.

In this embodiment, a semiconductor of high mobility was used as a semiconductor of the device, however, it is obvious that a semiconductor of other crystalline structure can be used instead.

In this embodiment, the liquid crystal electro-optic device is described, however, it is obvious that the modified transfer gate C/TFTs in accordance with the present invention can be used for other electro-optic devices in which voltage is applied to a picture element electrode, whereby some sort of displaying operation is to be made.

A salient feature of the present invention is: two TFTs provided on one picture element in a complimentary structure; and the liquid crystal electric potential $V_{LC}$, that is an electric potential of the electrode 32, is fixed to either a level in case of PTFT being ON and NTFT being OFF or a level in case of PTFT being OFF and NTFT being ON.

Figure 5:
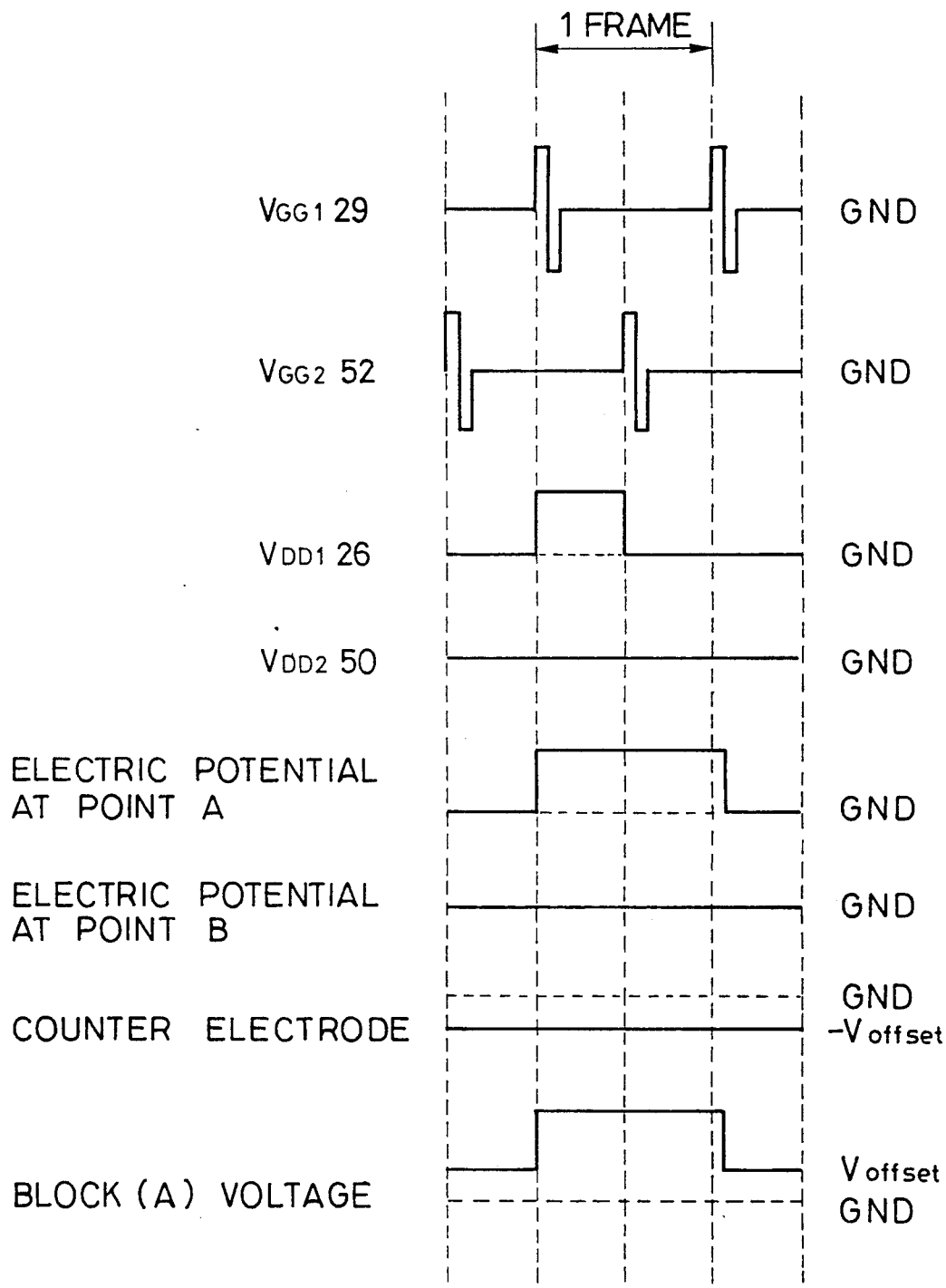
FIG. 5 shows a driving signal waveform input to each signal line at the time of driving the active matrix liquid crystal electro-optic device in accordance with the present invention.

Principle of operation of this embodiment is explained below using FIGS. 2 and 5. FIG. 2 shows the equivalent circuit of 2×2 matrix structure, with a view to explaining the principle of operation of this embodiment. By applying signal voltages to signal lines $V_{GG1}$ 29, $V_{GG2}$ 52, $V_{DD1}$ 26, and $V_{DD2}$ 50 shown in the figure, voltage is applied to the liquid crystal 1 in FIG. 2, so as to operate a known liquid crystal display. FIG. 5 shows a waveform chart of the driving signal voltage applied to the signal lines $V_{GG1}$ 29, $V_{GG2}$ 52, and $V_{DD1}$ 26, $V_{DD2}$ 50, as well as to the counter electrode 55, for applying voltage to the liquid crystal existing on a point A. As shown in FIG. 5, one frame is divided into two in case of 2×2 matrix. The voltage actually applied to the liquid crystal 1 in this case is indicated as block (A) voltage. Though digital operation (ON/OFF operation) is carried out by the application of the voltage shown in FIG. 5, signal voltages applied to $V_{DD1}$ and $V_{DD2}$ should be modified as are suited to degree of the gradation. For example, in the case shown in FIG. 2, if the transmissivity of the liquid crystal at the point A is to be large, the signal voltage of higher voltage will be applied to $V_{DD1}$ in FIG. 5 according to the transmissivity of the liquid crystal, whereas if the transmissivity of the liquid crystal is to be small instead, the signal voltage of lower voltage will be applied thereto.

The signal voltage applied to $V_{GG1}$, $V_{GG2}$ must be larger than the threshold voltage $V_{th}$ of C/TFTs, i.e. $V_{GG} > V_{th}$. Further, as shown in FIG. 5, application of $V_{OFFSET}$ to the counter electrode with a negative electric potential is useful in gradation display which is carried out by the use of relationship between light transmissivity of liquid crystal and voltage applied thereto because the application of the negative electric potential $V_{OFFSET}$ makes the block (A) voltage large. And it is preferred that absolute value of $V_{OFFSET}$ is not more than that of threshold voltage of the liquid crystal.

Preferred Embodiment 2

Figures 6A, 6C:
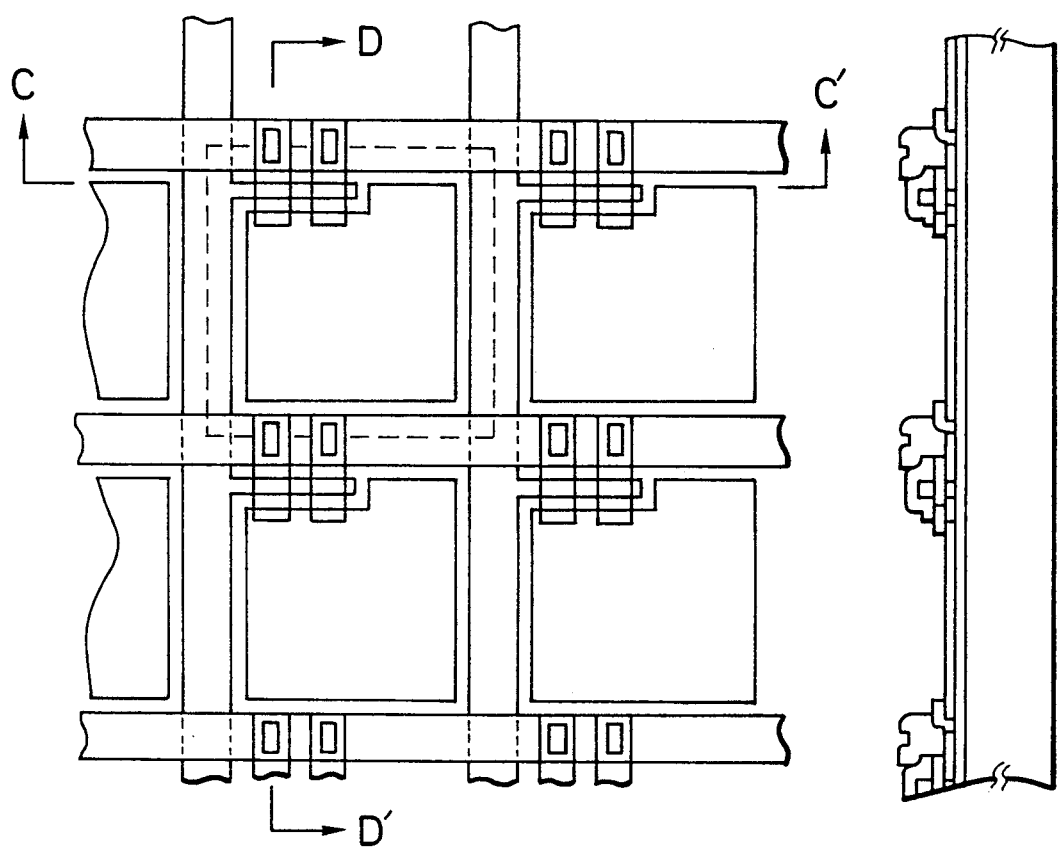
FIG. 6(A) is a top view showing another example of arrangement of electrode and the TFT corresponding to 2×2 of the active matrix liquid crystal electro-optic device in accordance with the second preferred embodiment.
FIG. 6(B) and FIG. 6(C) are cross sectional views corresponding to the positions indicated as C—C' and D—D' lines of FIG. 6(A), respectively.
Figure 6B:
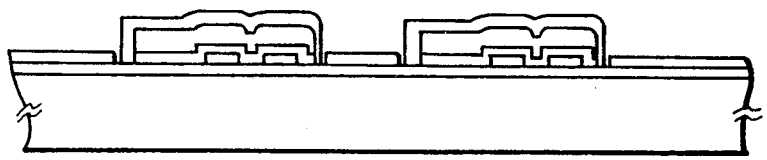

Referring to FIGS. 6(A) to 6(C), a liquid crystal electrooptic device in accordance with a second preferred embodiment will be described. The picture element electrode 32 made of a transparent conductive film was formed last in the first embodiment, whereas, in the second embodiment, a transparent conductive film is formed at first on the blocking layer 41 of the substrate, and is patterned, so as to obtain a picture element electrode 32. Therefore, there is no fear that disconnection occurs. And since after the patterning of the picture element electrode 32 p-channel transistors and n-channel transistors were formed on the substrate, the transistors were not damaged by the patterning of the picture element electrode 32. The other manufacturing process and the structure of the device are the same as the first embodiment, and are thus omitted here.

Preferred Embodiment 3

In this embodiment, as shown in FIG. 8, a liquid crystal electro-optic device provided with modified transfer gate TFTs in complimentary structure using an anode plate technique (anodic oxidation technique), was adopted. The manufacturing of TFT in accordance with this embodiment is basically the same as that in accordance with the first embodiment, and the process is proceeded in almost the same manner as depicted in FIG. 3, however, a metallic material is used for a gate electrode and an oxide film is formed as an insulating film by oxidizing the gate electrode made of the metallic material by the anodic oxidation technique.

As shown in FIG. 8, gates of PTFT 95 and of NTFT 96 are connected to a common gate line 107, and source or drain regions are connected together, which are connected to other signal line 102, while the other source or drain regions are connected to a picture element electrode 108 in common.

Referring to FIGS. 7(A) through 7(G), a silicon oxide film was formed on a glass substrate 98 to 1000-3000 Å by magnetron RF(high frequency) sputtering, as a blocking layer 99. Process conditions were: atmosphere of 100% oxygen; depositing temperature of 15° C.; output of 400-800W; and pressure of 0.5 Pa. A depositing rate in case of using quartz or single crystalline silicon as target was 30-100 Å/minute.

A silicon film 97 was formed on the blocking layer 99 by LPCVD(Low Pressure Chemical Vapor Deposition), sputtering, or plasma CVD.

Figure 7A:
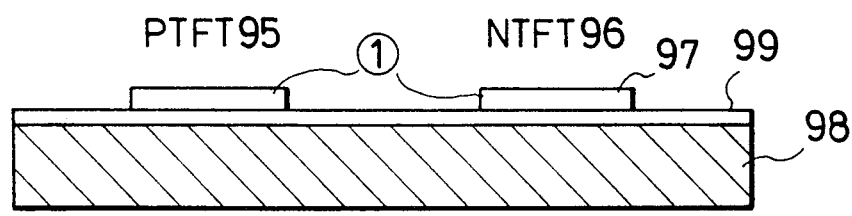
FIGS. 7(A)–(G) are cross sectional views showing a manufacturing process of the TFT corresponding to the third preferred embodiment.

Referring to FIG. 7(A), photo-etching was carried out on the silicon film with a first photomask ①, so as to form a region for PTFT on the left hand side of the drawing, as well as a region for NTFT on the right hand side.

A silicon oxide film was formed in 500-2000Å, e.g. at 700Å, as a gate insulating film 103. The manufacturing conditions were the same as those for the silicon oxide film 99 as a blocking layer.

An alloy film of aluminum and silicon was formed on the gate insulating film 103 to a thickness of 3000 Å-1.5 μm, e.g. 1 μm by known sputtering, as a film for the gate electrode 107.

As the gate electrode material, besides aluminum silicide, molybdenum(Mo), tungsten(W), titanium(Ti), tantalum(Ta), chromium(Cr) can be used, as well as an alloy for which silicon is mixed with these species, an alloy of these species. Also, a multi-layered film comprising a silicon layer and a metallic layer can be used for the gate electrode.

Figure 7B:
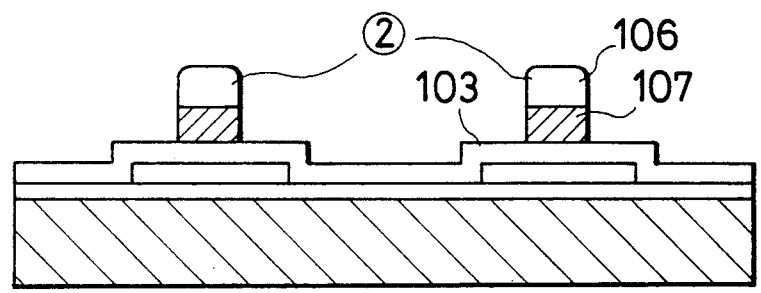

A silicon oxide film was formed on the gate electrode material at 3000 Å-1 μm, e.g. 6000 Å by sputtering, as an insulating film, and subsequently the insulating film and the gate electrode material were patterned by a second photomask ②, so as to form the gate electrode 107 and the insulating film 106, as shown in FIG. 7(B).

Figure 7C:
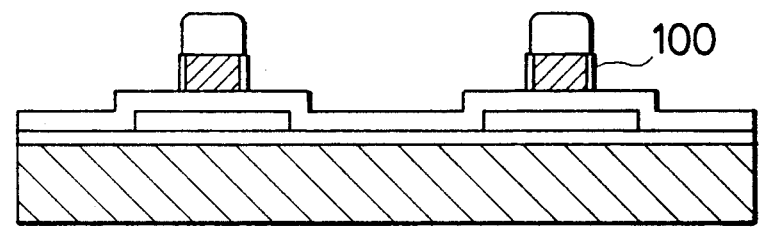

The structure formed by the foregoing steps was then immersed in an AGW electrolyte comprising propylene glycol and a 3% tartaric acid solution at a ratio of 9:1, and the gate electrode of the aluminum silicide was connected to an anode of a power source, and, with the use of platinum as a counter cathode, dc electric power was applied. The gate electrode being connected for each gate wiring, a connection terminal was provided in such a way that all of the gate wirings were sandwiched and were connected in the vicinity of the end of the substrate, and anodic oxidation was performed, so as to form the anodic oxidation film 100 in the vicinity of the side surface of the gate electrode, as shown in FIG. 7(C).

As the solution used for the anodic oxidation, a mixed acid and the like for which ethylene glycol or propylene glycol and so on are added to a strong acid solution such as sulfuric acid, nitric acid, and phosphoric acid, or to tartaric acid, or citric acid, are typically used. According to the variable needs, salt or alkali solution can be mixed therewith, in order to adjust pH of the required solution.

The anodic oxidation was carried out by letting current run for 30 minutes at the current density of 2.5 mA/cm$^2$ in a constant-current mode, and subsequently carrying out 5 minutes process in a constant-voltage mode, so as to form aluminum oxide of 2500 Å in thickness, in the vicinity of the side surface of the gate electrode. The examination of the insulating characteristic of the aluminum oxide using the sample manufactured under the same conditions as the above oxidation process, showed its characteristic as $10^9$ Ωm of resistivity, $2 \times 10^5$ V/cm of dielectric strength.

Through the observation of the surface of the sample by scanning electron microscope, unevenness on the surface was observed when magnified up to approximately 8000 times, however, a fine hole was not observed, which is an evidence of a good insulating coating.

Figure 7D:
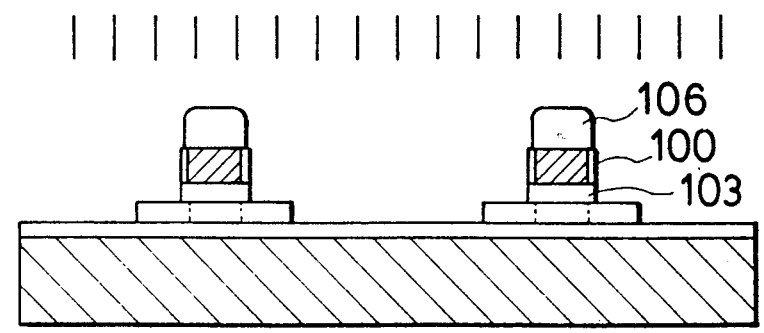
Figure 7E:
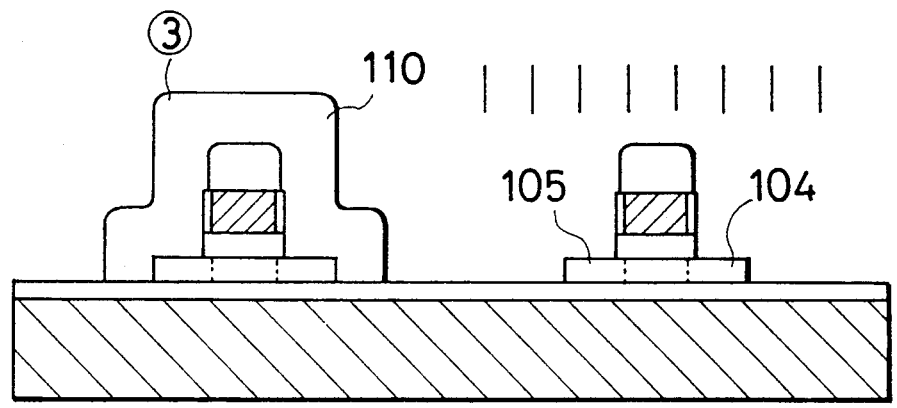
Figure 7F:
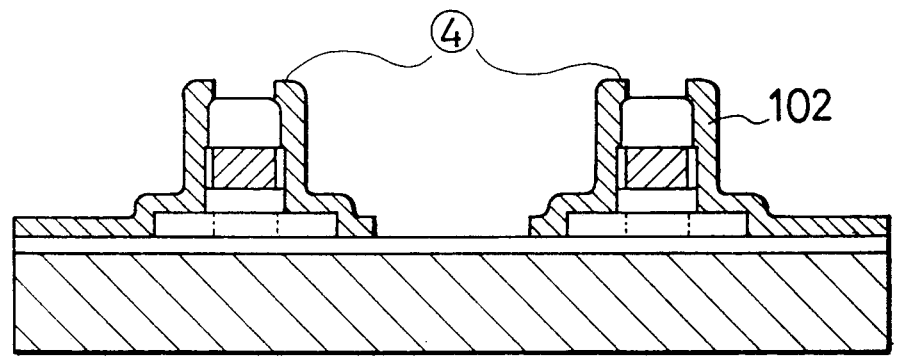

After the insulating film 103 was removed by etching as shown in FIG. 7(D), boron was added to the entire surface of the substrate by ion implantation at a dose of $1-5 \times 10^{15}$ cm$^{-2}$ as an impurity for the use as PTFT. The doping concentration was approximately $10^{19}$ cm$^{-3}$, and source and drain regions for PTFT were thus formed. In this embodiment, ion doping was carried out after the removal of the surface insulating film, however, doping through the insulating film 103 on the semiconductor film can be carried out by suitable conditions.

A photoresist 110 was then formed using a third photomask ③ to cover the PTFT region therewith as shown in FIG. 7 (E), and subsequently phosphorus was added to the source and drain regions for NTFT by ion implantation at a dose of $1-5 \times 10^{15}$ cm$^{-2}$. The doping concentration was about $10^{20}$ cm$^{-3}$. The ion doping process was carried out in an ion implanting direction oblique to the substrate. Impurities reach a region under the anodic oxidation film and the ends of the source and drain regions 104 and 105 are almost aligned with the ends of the gate electrode. Sufficient insulating effect is ensured by the anodic oxidation film 100, to the electrode wiring formed in the following process, which fact omits the formation of another insulating film.

Laser light was then irradiated to the source and drain regions for activation process, which was carried out instantaneously, thus no need arise for caring about the diffusion of the metal material used for the gate electrode, and the TFT of high reliability was thus manufactured.

On the entire surface of all of these, aluminum was formed by sputtering, and after an electrode lead 102 was obtained by patterning the aluminum by a fourth mask ④, the semiconductor film protruded from the electrode 102, the insulating film 106 on the gate electrode 107, as well as from the anodic oxidation film 100 in the vicinity of the side surface of the gate electrode 107, was removed by etching, and perfect device separation was carried out, so as to complete the TFT. In this manufacturing process, complementary TFTs were manufactured with four masks.

Figure 7G:
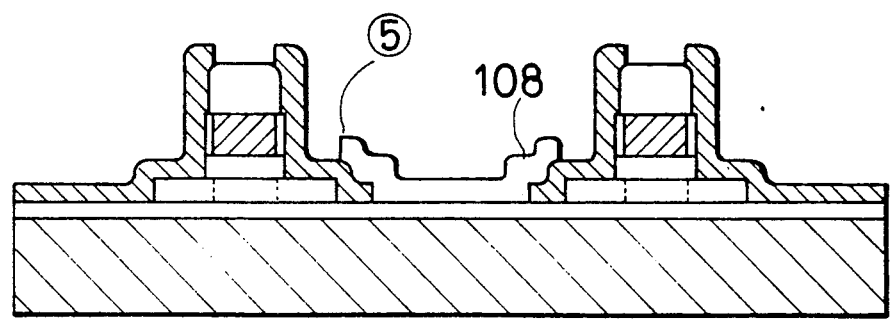

As shown in FIG. 7(G), two TFTs are complementary transistors, and ITO (Indium Tin Oxide film) was formed by sputtering to connect the output end of the two TFTs to an electrode of one picture element of the liquid crystal device. It was etched with a fifth photomask ⑤, so as to form the picture element electrode 108.

Figure 8A:
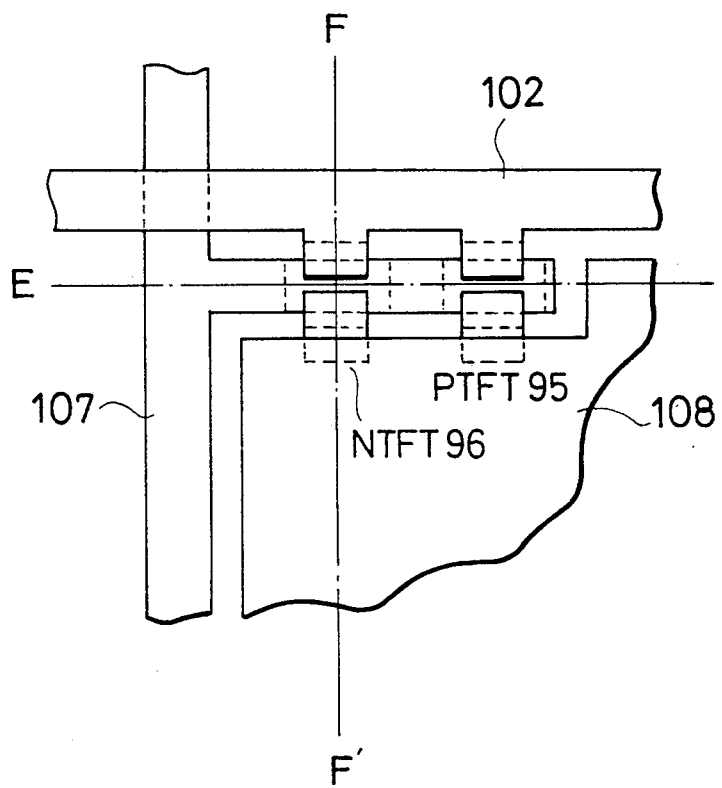
FIG. 8(A) is a plan view showing a part of an active matrix liquid crystal electro-optic device in accordance with the third embodiment of the present invention.
Figure 8B:
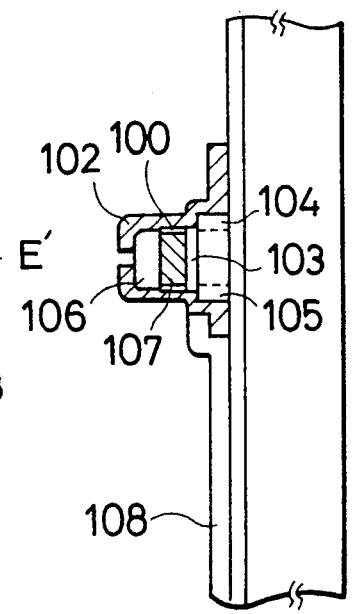
FIG. 8(B) and FIG. 8(C) are cross sectional views corresponding to the positions indicated as F—F' and E—E' lines in FIG. 8(A), respectively.
Figure 8C:
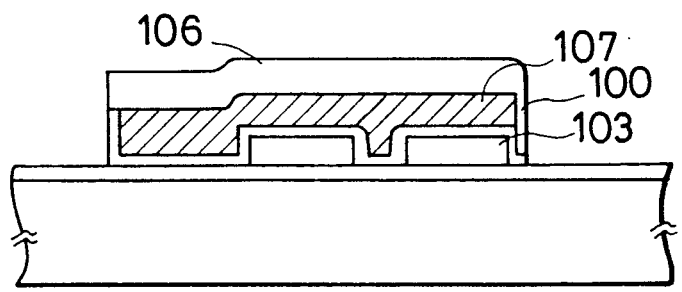

In this way, the modified transfer gate TFT having the arrangement and structure shown in FIGS. 8(A), (B), and (C) was completed. FIG. 8(B) is a cross sectional view corresponding to the F—F' cross section of FIG. 8 (A), while FIG. 8(C) is a cross sectional view corresponding to the E—E' cross section of FIG. 8(A). As is obvious from FIGS. 8(B) and (C), the interlayer insulating film 106 never fail to exist on the gate electrode 107, and the lead of the gate wiring 107 and the lead of the source or drain wiring 102 were sufficiently insulated from each other at the intersection of the lead of the gate wiring 107 and the lead of the source of drain wiring, and generation of wiring capacity at the intersection was thus suppressed.

In this way, in this embodiment, an active device substrate whose capacity in the vicinity of wiring is much less, for which the possibility of shortcircuit in the vicinity of the gate insulating film is much less, and which has complementary TFTs, was completed with the number of masks less than that in accordance with the first embodiment, and without using a highdegree process technique of anisotropic etching.

The substrate formed by the foregoing steps and a second substrate (a counter substrate) on which a counter electrode is formed and an orientation control film is further formed are mated and STN liquid crystal is injected between the substrates by known method, whereby an active matrix STN liquid crystal electro-optic device is completed.

Exemplified applications to the liquid crystal electro-optic device were described in all of the above-mentioned cases, however, it is obvious that, far from being limited to the examples, applications to other devices and to a three-dimensional integrated circuit device and the like, are possible.

By this embodiment, the manufacturing of TFT device using the number of masks far less than in the conventional case becomes possible. By manufacturing a semiconductor product with the application of a device of this structure, manufacturing process was facilitated while production yield was improved, as the number of masks becomes smaller, and a semiconductor application device of low manufacturing cost was thus offered.

This embodiment is characterized by using a metallic material for the gate electrode so as to provide an oxide film on the surface thereof by means of the anodic oxidation of the metallic material, and by providing a three-dimensional wiring having a grade separation thereupon. In addition, since the gate electrode and the oxide film provided on the side surface of the gate electrode do not hinder contact of leads to source and drain regions, the TFTs become smaller or the channel region becomes nearer to the leads. Therefore, the reduction in frequency characteristic of the device and the increase in ON resistance were prevented.

When aluminum was used for the gate electrode material as described in this embodiment, $H_2$ was changed to H in the gate oxide film at the time of annealing in a device forming process, due to the catalytic effect of aluminum, and accordingly hydrogen in the gate oxide film was reduced and interface state density ($Q_{SS}$) was reduced, compared to when a silicon gate was used instead, whereby device characteristic was improved.

Since the source and drain regions of TFT, as well as the contact of the electrode connected to the source and drain regions were formed in a self-aligning manner, the area of the device required for TFT is reduced, and the degree of integration can be improved thereby. When the TFT was used as an active device of the liquid crystal electro-optic device, aperture ratio of a liquid crystal panel was improved.

The TFT having characterized structure as described above can be manufactured by the use of as few as two or more masks.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

What is claimed is:

1. An electro-optic device comprising:
   a pair of p-channel transistor and n-channel transistor provided in said electro-optic device and connected to each other in parallel, each of said p-channel transistor and said n-channel transistor comprising a gate electrode and two input/output terminals,
   wherein the gate electrode of said p-channel transistor is connected to the gate electrode of said n-channel transistor and one of the input/output terminals of said p-channel transistor and one of the input/output terminals of said n-channel transistor are connected to each other and the other one of the input/output terminals of said p-channel transistor and the other one of the input/output terminals of said n-channel transistor are connected to each other.

2. The device of claim 1 further comprising:
   a pair of substrates; and
   a liquid crystal provided between said substrates,
   wherein said p-channel transistor and said n-channel transistor are provided on one of said substrates.

3. The device of claim 2 further comprising an electrode island provided on said one of said substrates and connected to said p-channel transistor and said n-channel transistor.

4. An electro-optic device comprising:
   a substrate;
   a pair of p-channel transistor and n-channel transistor provided on said substrate and connected to each other in parallel, each of said p-channel transistor and said n-channel transistor comprising a gate electrode and two input/output terminals;
   a pair of a first signal line and a second signal line provided on said substrate; and
   an electrode island provided on said substrate,
   wherein one of the input/output terminals of said p-channel transistor and one of the input/output terminals of said n-channel transistor are connected to said electrode island and the other one of the input/output terminals of said p-channel transistor and the other one of the input/output terminals of said n-channel transistor are connected to one of said first signal line and said second signal line and the gate electrode of said p-channel transistor and the gate electrode of said n-channel transistor are connected to the other one of said first signal line and said second signal line.

5. The device of claim 4 further comprising:
   a substrate; and a liquid crystal provided between the substrates.

6. An electro-optic device comprising:

a pair of substrates;

a liquid crystal provided between said substrates;

electrode islands provided on one of said substrates in matrix form;

signal lines provided on said one of said substrates; and pairs of complementary transistors provided on said one of said substrates, each one of said pairs comprising a p-channel transistor and an n-channel transistor connected to each other in parallel, wherein each of said transistors comprises a gate electrode and two input/output terminals and one of the input/output terminals of said p-channel transistor and one of the input/output terminals of said n-channel transistor are connected to one of said electrode islands and the other one of the input/output terminals of said p-channel transistor and the other one of the input/output terminals of said n-channel transistor are connected to one of said signal lines and the gate electrode of said p-channel transistor and the gate electrode of said n-channel transistor are connected to another one of said signal lines.

7. The device of claim 6 wherein said electrode islands comprise indium tin oxide.

8. The device of claim 6 wherein each of said transistors comprises a channel region located between source and drain regions thereof under a gate electrode thereof and comprising a semiconductor selected from the group consisting of a semiamorphous semiconductor and a semi-crystal semiconductor.

* * * * *